(12) United States Patent
Audet et al.

(10) Patent No.: US 7,268,570 B1
(45) Date of Patent: Sep. 11, 2007

(54) APPARATUS AND METHOD FOR CUSTOMIZED BURN-IN OF CORES ON A MULTICORE MICROPROCESSOR INTEGRATED CIRCUIT CHIP

(75) Inventors: Jean Audet, Granby (CA); Louis B. Capps, Jr., Georgetown, TX (US); Glenn G. Daves, Fishkill, NY (US); Joanne Ferris, Essex, VT (US); Anand Haridass, Austin, TX (US); Ronald E. Newhart, Essex Junction, VT (US); Michael J. Shapiro, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/426,646

(22) Filed: Jun. 27, 2006

(51) Int. Cl.
*G01R 31/02* (2006.01)
(52) U.S. Cl. ................................. 324/760
(58) Field of Classification Search ............. None
See application file for complete search history.

(56) References Cited

U.S. PATENT DOCUMENTS

| | | |
|---|---|---|
| 5,420,520 A | 5/1995 | Anschel et al. |
| 5,804,459 A | 9/1998 | Bolam et al. |
| 5,872,797 A | 2/1999 | Theodoseau |
| 6,094,059 A | 7/2000 | Frankeny et al. |
| 6,731,179 B2 | 5/2004 | Abadeer et al. |
| 6,762,617 B2 * | 7/2004 | Iwase et al. ............. 326/11 |
| 6,820,029 B2 | 11/2004 | Fang et al. |
| 7,159,313 B2 * | 1/2007 | Sathe et al. ............ 29/846 |

OTHER PUBLICATIONS

U.S. Appl. No. 11/469,550, filed Sep. 1, 2006, Capps, Jr. et al.

* cited by examiner

*Primary Examiner*—Ha Tran Nguyen
*Assistant Examiner*—Trung Q. Nguyen
(74) *Attorney, Agent, or Firm*—Stephen J. Walder, Jr.; Diana R. Gerhardt

(57) ABSTRACT

An apparatus and method for providing a multi-core integrated circuit chip that reduces the cost of the package and board while optimizing performance of the cores for use with a single voltage plane. The apparatus and method of the illustrative embodiments make use of a dynamic burn-in technique that optimizes all of the cores on the chip to run at peak performance at a single voltage. Each core is burned-in with a customized burn-in voltage that provides uniform power and performance across the whole chip. This results in a higher burn-in yield and lower overall power in the integrated circuit chip. The optimization of the cores to run at peak performance at a single voltage is achieved through use of the negative bias temperature instability affects on the cores imparted by the burn-in voltages applied.

20 Claims, 4 Drawing Sheets

APPARATUS AND METHOD FOR CUSTOMIZED BURN-IN OF CORES ON A MULTICORE MICROPROCESSOR INTEGRATED CIRCUIT CHIP

BACKGROUND

1. Technical Field

The present application relates generally to an apparatus and method for providing an improved integrated circuit device. More specifically, the present application is directed to an apparatus and method for customized burn-in of cores on a multicore microprocessor integrated circuit chip.

2. Description of Related Art

In the manufacture and testing of integrated circuit chips, a common technique is to form a wafer of semi-conductive material, such as silicon, and to form in and on the wafer the necessary circuitry for a multiplicity of integrated circuit chips. The wafer is formed with all of the circuitry necessary for the functioning of each of the chips, including I/O contacts for connecting to I/O signals, power and ground. The contacts may be for either wire bond connections or compressive bonding connections or for controlled collapse chip connect (C4) bonds which utilizes solder balls for flip chip bonding.

Whatever type of contact is to be made to the chip, it is necessary for the chip to be tested and a determination made as to whether the chip is good, i.e. operates correctly. This testing normally includes what is known as a "chip burn-in." The burn-in process is intended to accelerate the early life of the integrated circuit chip so as to expose those chips that will fail. That is, it has been determined that the failure rate of integrated circuit devices is greatest at the beginning and end of the average life cycle of an integrated circuit chip. The relationship between failure rate of integrated circuits and time, both for testing and for application of end users, is usually referred to as a bathtub curve. An example of this bathtub curve is shown in FIG. 2.

As shown in FIG. 2, with the increase of time (period), the bathtub curve can be divided into an infant mortality period, a normal life period, and a wear out period. The infant mortality period usually corresponds to failure induced by defects of fabrication and usually lasts about several weeks. The normal life period usually corresponds to some random failures and usually lasts about twenty, thirty, or more years. The wear out period usually corresponds to failure induced by long-time waste and is continuously increased while time goes by.

The burn-in process is intended to accelerate the life of the integrated circuit chips through the infant mortality period to thereby identify which chips have fabrication defects and will fail. In order to perform such accelerated testing, a testing environment that is harmful and dangerous to the integrated circuit chips is generated by testing equipment and the relationship between the failure rate and testing time is measured. In order to generate the harmful testing environment, the chips are heated to an elevated temperature above which they are rated to function, and stressed by the application of voltage and current, also often in excess of what the chip is rated to withstand. The difference between the testing environment and a normal operating environment is used to estimate the relationship between failure rate and real time, which is the experienced time under the normal environment.

In the past, this burn-in process has normally taken place on the individual chips after the wafer has been diced to form the individual chips, often after the chips have been packaged. Thus, in the past, it was necessary to form the chips, individually handle the chips and test the chips individually, and only then were bad chips detected. An example of testing such chips is shown in commonly assigned U.S. Pat. No. 5,420,520, which is hereby incorporated by reference. While this type of testing does work well, it requires a significant amount of processing of the wafer following the formation of the circuitry on and in the wafer before a determination is made that a chip is indeed bad. Moreover, the device of U.S. Pat. No. 5,420,520, has a direct connection between the tester head and the chip. When the tester head connection is worn, the entire head must be discarded, or at least significantly reworked.

Commonly assigned U.S. Pat. No. 6,094,059, which is hereby incorporated by reference, provides an improved mechanism for performing burn-in/testing of integrated circuit chips that avoids the drawbacks of the mechanism described in U.S. Pat. No. 5,420,520. According to the mechanism in U.S. Pat. No. 6,094,059, a technique for testing/stressing integrated circuit devices, and especially wafers, having a plurality of contacts on one face thereof arranged in a predetermined pattern is provided. The technique includes providing an interposer, with the interposer including a dielectric substrate having a device contact face and a tester contact face. A first plurality of releasable connectors is provided on the device contact face arranged in the same predetermined pattern, and a second plurality of releasable connectors is provided on the tester contact face, also arranged in the same predetermined pattern. Conducting vias connect the corresponding connectors of the first and second releasable connectors respectively. A test head is provided having a plurality of contact pads also arranged in the same predetermined pattern. Circuitry is provided on the test head to connect each of the contact pads thereon with external leads extending to provide signal contact to each of the contact pads on the test head. The interposer is positioned between the IC device and the test head, with the contacts on the IC device in contact with the first plurality of connectors and the contact pads on the test head in contact with the second plurality of connectors.

Signals are provided to the connector pads from the electrical leads for performing testing and/or burn-in of the integrated circuit device. The test head can be heated to provide the necessary heat for testing at elevated temperatures, although preferably the entire assembly of the test head, interposer and IC device is placed in an oven which is heated to a controlled temperature, at which point the electrical testing signals are provided from an external source. The oven itself, in some instances, may be provided with outlets to connect with the electrical leads, thus connecting the leads to the exterior of the oven for the reception of the electrical signals.

Regardless of the particular mechanisms used to perform the burn-in process, be it the mechanism in U.S. Pat. No. 5,420,520, U.S. Pat. No. 6,094,059, or another mechanism, burn-in parameters used to control the burn-in process are set and run at the chip level. Thus, the entire chip is burned-in using the same temperature and voltage parameters.

Modern multi-core (or multiprocessor) microprocessor integrated circuit chips require separate voltage planes for each processor core in order to optimize performance of the cores (or processors). As the number of cores grows, so do the number of voltage planes that are needed in the integrated circuit chip. This leaves the architect two choices using today's technology: (1) keep adding voltage planes which increase the wiring needed for each part on the chip, package and board, as well as the amount of voltage regulator modules (VRMs) on the board; or (2) use one voltage plane for the multicore processors. The second option is less expensive, however it sub-optimizes the performance of the part for the cores that need a different voltage from the main voltage provided by the one voltage plane in order to perform at an optimum speed.

If a known burn-in process is applied to an integrated circuit chip using the single voltage plane approach discussed above, the burn-in is performed using chip level burn-in parameters. Thus, the same voltage and temperature is applied to all of the cores. Therefore, even after burn-in, the cores may still operate at sub-optimal speed due to the single voltage plane and the different voltage requirements of the various cores for running at speed.

SUMMARY

The illustrative embodiments provide an apparatus and method for providing a multi-core integrated circuit chip that reduces the cost of the chip while optimizing performance of the cores for use with a single voltage plane. The apparatus and method of the illustrative embodiments make use of a dynamic burn-in technique that optimizes all of the cores on the chip to run at peak performance at a single voltage. Each core is burned-in with a customized burn-in voltage that provides uniform power and performance across the whole chip. This results in a higher burn-in yield and lower overall power in the integrated circuit chip.

The illustrative embodiments operate based on the observation that a side product of the stress applied by the burn-in process is the negative bias temperature instability (NBTI) threshold shift induced in P channel devices of a processor or core. This NBTI threshold shift affects the way in which the chip runs later in normal functional mode from a performance and voltage perspective. The illustrative embodiments make use of the core voltage islands, i.e. isolated voltage planes per core, provided in modern multicore chip designs to drive different burn-in voltages to each core affecting their post burn-in operation characteristics in a positive manner.

Multi-core microprocessors are large chips that have inherent process variations resulting in varying power and performance at different points on the chip. These variations are driven by photolithographic and etch differences in the N and P channel polysilicon dimensions. The burn-in conditions (voltage and temperature) determine the amount of P channel NBTI threshold shift. NBTI, as described, for example, in U.S. Pat. No. 6,731,179, is a phenomenon of P channel field effect transistors (PFETs) with p+ polysilicon doped gates in which an instability is exhibited after voltage/temperature aging. The instability occurs under negative gate voltage and is measured as an increase in the magnitude of threshold voltage of the device. Higher stress temperatures produce more degradation. The degradation caused is exponential with oxide electric field.

Typically, NBTI threshold shifts are viewed as a reliability problem in modern integrated circuit devices. However, with the illustrative embodiments, the affects of NBTI threshold shifts are used to customize burn-in voltages for cores of a multicore integrated circuit chip so as to be able to fine tune the operation of each core. In other words, by applying higher or lower burn-in voltage, or applying such voltages and temperatures for longer periods of time, it is possible to create higher or lower NBTI shifts that modulates the power and performance of a given microprocessor core. The exact amount of burn-in voltage applied to each core may be determined by incoming power and performance of each core based upon the corresponding process tolerance variation that occurred during semiconductor fabrication. In this way, each core may be fine tuned such that uniform power consumption and performance across the whole chip is achieved. As a result, a single voltage plane may be used to provide voltages to the multicore integrated circuit chip, thereby reducing the cost of the package and circuit board.

In one illustrative embodiment, a method, in a data processing system, is provided for dynamically burning-in cores of a multicore integrated circuit chip. The method may comprise applying an initial burn-in operation to a plurality of cores of the multicore integrated circuit chip based on an initial set of core burn-in parameters for the plurality of cores and measuring core operational characteristics of the plurality of cores. The method may further comprise adjusting core burn-in parameters for at least one core of the plurality of cores based on the measured core operational characteristics to thereby generate a second set of core burn-in parameters. The method may then apply a dynamic burn-in operation to the at least one core of the plurality of cores based on the second set of core burn-in parameters. At least two cores of the multicore integrated circuit chip may be burned-in using different burn-in voltages based on the dynamic burn-in operation.

The method may further comprise determining if the measured core operational characteristics of the plurality of cores are within a tolerance of a desired operation of the plurality of cores. The adjusting of the core burn-in parameters and applying the dynamic burn-in operation may be performed in response to a determination that the measure core operational characteristics of the at least one core are not within a tolerance of the desired operation of the plurality of cores.

The initial set of burn-in parameters may be chip-level burn-in parameters that apply to all of the cores in the plurality of cores. The second set of core burn-in parameters may comprise at least one group of burn-in parameters that are different from the first set of core burn-in parameters.

Applying the dynamic burn-in operation may comprise applying, to at least one core of the plurality of cores, a higher or lower burn-in voltage than at least one other core of the plurality of cores. Moreover, applying the dynamic burn-in operation may comprise applying, to at least one core of the plurality of cores, a burn-in voltage for a longer period of time than at least one other core of the plurality of cores. Furthermore, applying the dynamic burn-in operation may comprise applying a burn-in voltage to the transistor gates of the at least one core in the to thereby shift a voltage bias of the transistor gates to cause the transistor gates to operate at different voltages via negative bias temperature instability (NBTI) affects. Applying the dynamic burn-in operation may comprise using separate voltage planes to apply different burn-in voltages to at least two cores of the plurality of cores.

The dynamic burn-in operation may optimize all of the cores of the plurality of cores to run at peak performance at a single operational voltage. Furthermore, the multicore integrated circuit chip may be a heterogeneous multiprocessor device in which a main core operates based on a first instruction set and one or more other cores operate based on a second instruction set different from the first instruction set.

In a further illustrative embodiment, a computer program product comprising a computer useable medium having a computer readable program is provided. The computer readable program, when executed on a computing device, may cause the computing device to apply an initial burn-in operation to a plurality of cores of a multicore integrated circuit chip based on an initial set of core burn-in parameters for the plurality of cores and measure core operational characteristics of the plurality of cores. The computer readable program may further cause the computing device to adjust core burn-in parameters for at least one core of the plurality of cores based on the measured core operational characteristics to thereby generate a second set of core burn-in parameters. The computer readable program may also cause the computing device to apply a dynamic burn-in operation to the at least one core of the plurality of cores based on the second set of core burn-in parameters. The at least two cores of the multicore integrated circuit chip may be burned-in using different burn-in voltages based on the dynamic burn-in operation. The computer readable program may further cause the computing device to perform other ones, or combinations of, the operations outlined above with regard to the method illustrative embodiment.

In yet another illustrative embodiment, a system for dynamically burning-in cores of a multicore integrated circuit chip is provided. The system may comprise a burn-in test control device and a burn-in test head coupled to the burn-in test control device. The burn in test control device, via the burn-in test head, may apply an initial burn-in operation to a plurality of cores of the multicore integrated circuit chip based on an initial set of core burn-in parameters for the plurality of cores and may measure core operational characteristics of the plurality of cores. The burn in test control device may further adjust core burn-in parameters for at least one core of the plurality of cores based on the measured core operational characteristics to thereby generate a second set of core burn-in parameters. The burn in test control device may also, via the burn-in test head, apply a dynamic burn-in operation to the at least one core of the plurality of cores based on the second set of core burn-in parameters. At least two cores of the multicore integrated circuit chip may be burned-in using different burn-in voltages based on the dynamic burn-in operation.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

The illustrative embodiments provide an apparatus and method for performing customized burn-in of cores in a multicore integrated circuit chip. The mechanisms of the illustrative embodiments may be applied to any multicore integrated circuit chip and are not limited to any particular configuration. For purposes of illustration, however, the following description of the illustrative embodiments will make reference to the Cell Broadband Engine (CBE), also known as the Broadband Processor Architecture, available from International Business Machines, Inc., as an example of a multicore microprocessor that may be provided on an integrated circuit chip and stressed using the customized burn-in process of the illustrative embodiments. While the CBE will be used for illustrative purposes, this is not to state or imply any limitation with regard to the types of multicore integrated circuit chips in which the illustrative embodiments may be implemented or with which the illustrative embodiments may be utilized.

Figure 1:
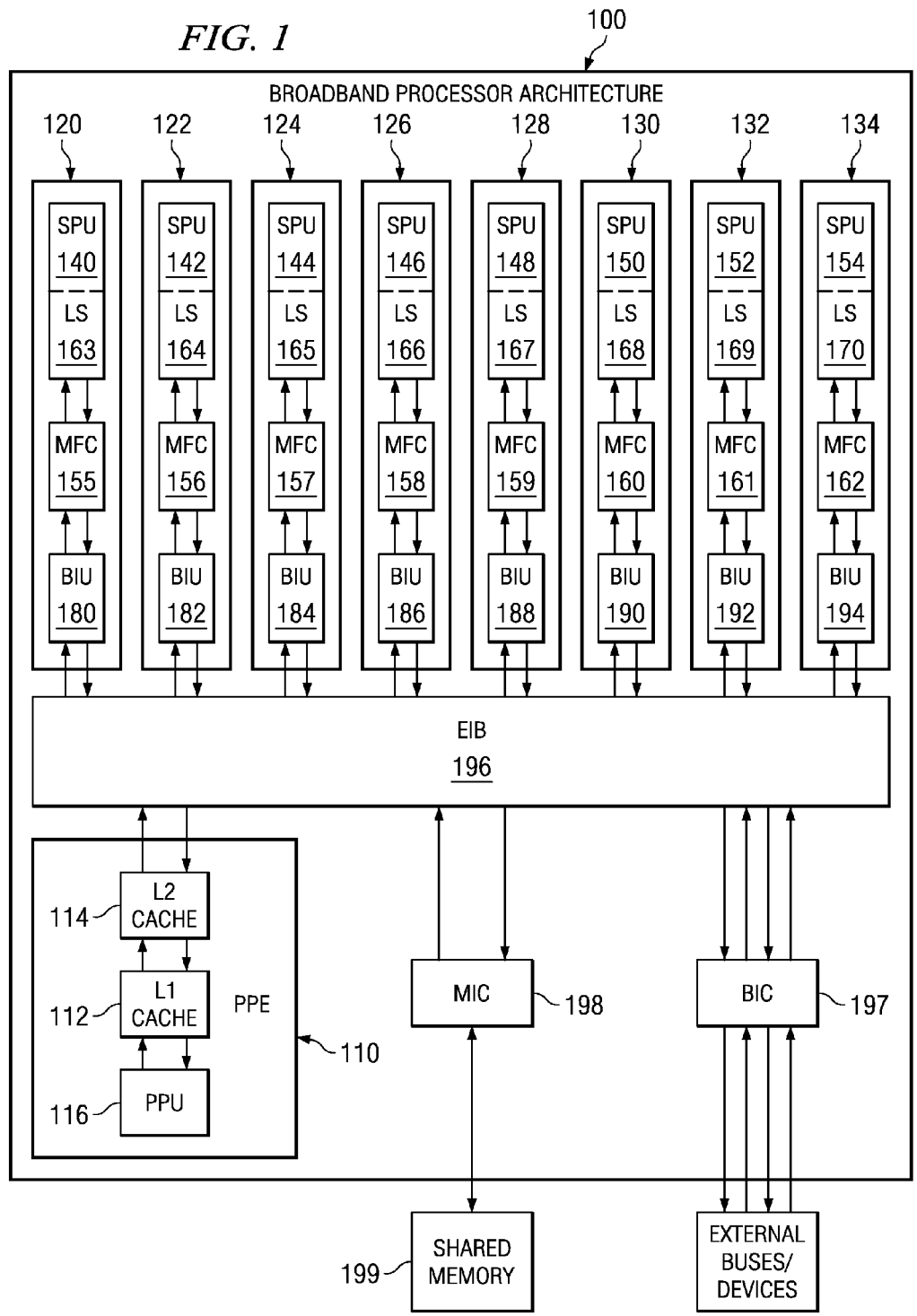
FIG. 1 is an exemplary block diagram of a multicore microprocessor upon which the illustrative embodiments may be utilized.

FIG. 1 is an exemplary block diagram of a data processing system in which aspects of the present invention may be implemented. The exemplary data processing system shown in FIG. 1 is an example of the Cell Broadband Engine (CBE) data processing system. While the CBE will be used in the description of the preferred embodiments of the present invention, the present invention is not limited to such, as will be readily apparent to those of ordinary skill in the art upon reading the following description.

As shown in FIG. 1, the CBE 100 includes a power processor element (PPE) 110 having a processor (PPU) 116 and its L1 and L2 caches 112 and 114, and multiple synergistic processor elements (SPEs) 120-134 that each has its own synergistic processor unit (SPU) 140-154, memory flow control 155-162, local memory or store (LS) 163-170, and bus interface unit (BIU unit) 180-194 which may be, for example, a combination direct memory access (DMA), memory management unit (MMU), and bus interface unit. A high bandwidth internal element interconnect bus (EIB) 196, a bus interface controller (BIC) 197, and a memory interface controller (MIC) 198 are also provided.

The CBE 100 may be a system-on-a-chip such that each of the elements depicted in FIG. 1 may be provided on a single microprocessor chip. Moreover, the CBE 100 is a heterogeneous processing environment in which each of the SPUs may receive different instructions from each of the other SPUs in the system. Moreover, the instruction set for the SPUs is different from that of the PPU, e.g., the PPU may execute Reduced Instruction Set Computer (RISC) based instructions while the SPU execute vectorized instructions.

The SPEs 120-134 are coupled to each other and to the L2 cache 114 via the EIB 196. In addition, the SPEs 120-134 are coupled to MIC 198 and BIC 197 via the EIB 196. The MIC 198 provides a communication interface to shared memory 199. The BIC 197 provides a communication interface between the CBE 100 and other external buses and devices.

The PPE 110 is a dual threaded PPE 110. The combination of this dual threaded PPE 110 and the eight SPEs 120-134 makes the CBE 100 capable of handling 10 simultaneous threads and over 128 outstanding memory requests. The PPE 110 acts as a controller for the other eight SPEs 120-134 which handle most of the computational workload. The PPE 110 may be used to run conventional operating systems while the SPEs 120-134 perform vectorized floating point code execution, for example.

The SPEs 120-134 comprise a synergistic processing unit (SPU) 140-154, memory flow control units 155-162, local memory or store 163-170, and an interface unit 180-194. The local memory or store 163-170, in one exemplary embodiment, comprises a 256 KB instruction and data memory which is visible to the PPE 110 and can be addressed directly by software.

The PPE 110 may load the SPEs 120-134 with small programs or threads, chaining the SPEs together to handle each step in a complex operation. For example, a set-top box incorporating the CBE 100 may load programs for reading a DVD, video and audio decoding, and display, and the data would be passed off from SPE to SPE until it finally ended up on the output display. At 4 GHz, each SPE 120-134 gives a theoretical 32 GFLOPS of performance with the PPE 110 having a similar level of performance.

The memory flow control units (MFCs) 155-162 serve as an interface for an SPU to the rest of the system and other elements. The MFCs 155-162 provide the primary mechanism for data transfer, protection, and synchronization between main storage and the local storages 163-170. There is logically an MFC for each SPU in a processor. Some implementations can share resources of a single MFC between multiple SPUs. In such a case, all the facilities and commands defined for the MFC must appear independent to software for each SPU. The effects of sharing an MFC are limited to implementation-dependent facilities and commands.

As mentioned above, modern multi-core (or multiprocessor) microprocessor integrated circuit chips, such as the microprocessor integrated circuit chip used to implement the CBE shown in FIG. 1, typically require separate voltage planes for each processor core in order to optimize performance of the cores (or processors). That is, different voltage planes are provided to accommodate process variation in the processor cores. Some cores may need more voltage in order to reach a desired frequency while other cores may need less voltage so that they do not drain too much power. Providing different voltage planes allows for such process variation.

For example, since the CBE architecture in FIG. 1 has a total of nine cores, i.e. one Power PC element and eight synergistic processing elements, the typical approach to fabricating the microprocessor integrated circuit chip may require that nine voltage planes be provided to provide separate voltages to each of the cores. The need for these additional voltage planes, and associated voltage regulator modules on the circuit board, greatly increase the cost of the multicore microprocessor integrated circuit chip and resulting circuit board.

An alternative approach is to use a single voltage plane on the package and board for all of the cores in the multicore microprocessor integrated circuit chip. The use of a single voltage plane simplifies the fabrication process and reduces the cost of both the package, because of the simplified fabrication, and circuit board, since fewer voltage regulator modules are required and because of fewer voltage lines needed. However, the use of a single voltage plane sub-optimizes the performance of the cores that need a different voltage from the main voltage provided by the one voltage plane in order to perform at an optimum speed.

The illustrative embodiments provide a mechanism for utilizing the single voltage plane approach while adjusting the operating characteristics of the cores through a customized burn-in process that takes advantage of the negative bias temperature instability (NBTI) threshold shift phenomenon. The customized burn-in process is a dynamic burn-in technique that optimizes all of the cores on the chip to run at peak performance at a single voltage. Each core is burned-in with a customized burn-in voltage that provides uniform power and performance across the whole multicore microprocessor integrated circuit chip. This results in a higher burn-in yield and lower overall power in the integrated circuit chip.

The illustrative embodiments operate based on the observation that a side product of the stress applied by the burn-in process is the NBTI threshold shift induced in P channel devices of a processor or core. NBTI, as described, for example, in U.S. Pat. No. 6,731,179, is a phenomenon of P channel field effect transistors (PFETs) with p+ polysilicon doped gates in which an instability is exhibited after voltage/temperature aging. The instability occurs under negative gate voltage and is measured as an increase in the magnitude of threshold voltage of the device. Higher stress temperatures produce more degradation. The degradation caused is exponential with oxide electric field.

This NBTI threshold shift affects the way in which the chip runs later in normal functional mode from a performance and voltage perspective. The illustrative embodiments make use of the core voltage islands, i.e. isolated voltage planes per core provided in modern multicore chip designs to drive different burn-in voltages to each core affecting their post burn-in operation characteristics in a positive manner. The burn-in conditions (voltage and temperature) determine the amount of P channel NBTI threshold shift.

It should be noted that the separate voltage planes are used to apply different burn-in voltages for each core, however the circuit board and substrate only need one voltage plane and thus, only one voltage regulator module is required on the circuit board.

Typically, NBTI threshold shifts are viewed as a reliability problem in modern integrated circuit devices. However, with the illustrative embodiments, the affects of NBTI threshold shifts are used to customize burn-in voltages for cores of a multicore integrated circuit chip so as to be able to fine tune the operation of each core. In other words, by applying higher or lower burn-in voltage, or applying such voltages and temperatures for longer periods of time, it is possible to create higher or lower NBTI shifts that modulate the power and performance of a given microprocessor core.

Figure 3A:
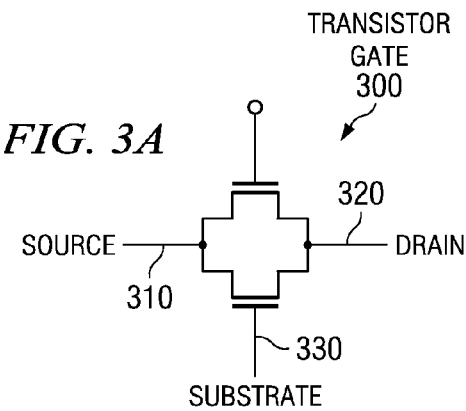
FIGS. 3A-3C are diagrams illustrating the electrical response due to a negative bias temperature stress applied to a transistor gate due to negative bias temperature instability.
Figure 3B:
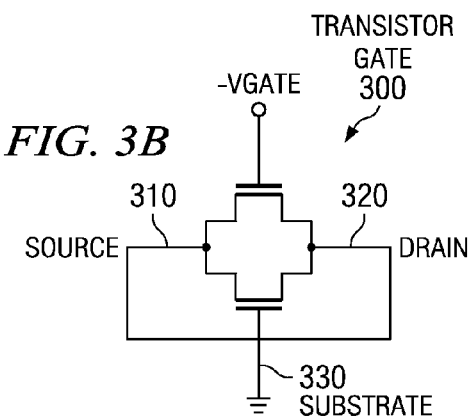
Figure 3C:
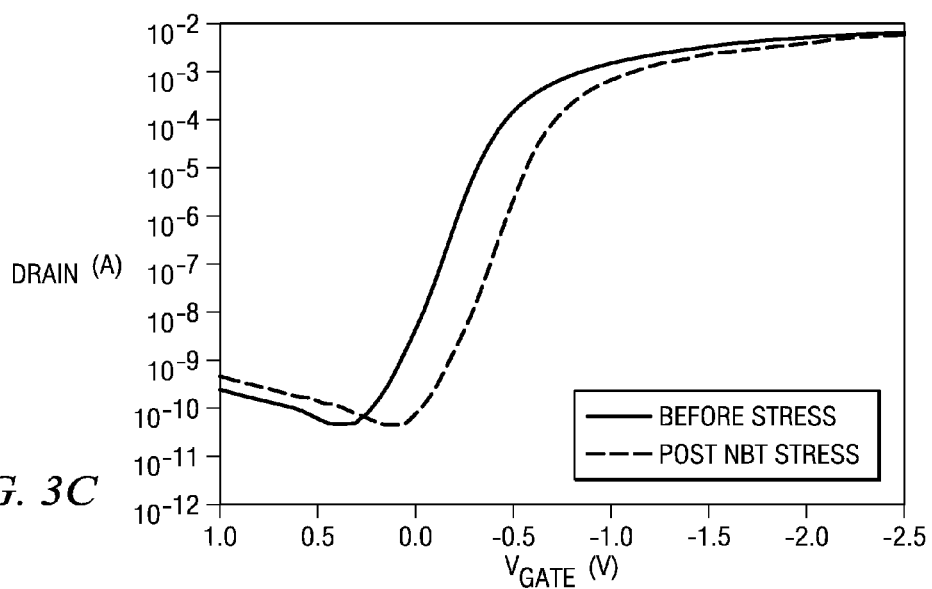

FIGS. 3A-3C are diagrams illustrating the electrical response due to a negative bias temperature stress applied to a transistor gate due to negative bias temperature instability. FIGS. 3A-3C show that by applying different burn-in times, voltages and/or temperatures, transistors in a core in a multiprocessor can be permanently changed to function at different voltages or temperatures during normal operation.

As shown in FIGS. 3A and 3B, after application of a stress voltage, i.e. a negative bias temperature (NBT) stress voltage, being applied to the transistor gate 300, the operating voltage of the transistor gate 300 is shifted such that the source 310 and drain 320 connections are grounded (substrate 330) and the transistor gate has a negative voltage bias (−Vgate).

This is shown graphically in the plot of $V_{gate}$ versus $I_{drain}$ shown in FIG. 3C. As shown in FIG. 3C, before the NBT stress is applied to the transistor gate 300, the voltage ($V_{gate}$) and current at the drain ($I_{drain}$) are as shown by the dark lined curve. After application of the NBT stress, the curve is shifted, as shown by the dotted line curve, to the right in the graph so as to shift the voltage of the gate ($V_{gate}$) in a negative voltage direction.

From FIGS. 3A-3C it can be seen that by applying a suitable voltage to the transistor gates of a core in a multicore microprocessor integrated circuit chip, the voltage bias of the gates may be shifted so as to cause the transistor gates to operate at different voltages via the NBTI affects. Thus, by controlling the amount of voltage being applied during a burn-in process, the temperature of the burn-in process, and the length of time that the burn-in voltage and temperature are applied, the operating characteristics of the transistor gates of a core may be fine tuned to a desired operating voltage, within a predetermined tolerance.

The exact amount of burn-in voltage applied to each core may be determined by incoming power and performance of each core based upon the corresponding process tolerance variation that occurred during semiconductor fabrication. In this way, each core may be fine tuned such that uniform power consumption and performance across the whole chip is achieved. As a result, a single voltage plane may be used to provide voltages to the multicore integrated circuit chip, thereby reducing the cost of the substrate and circuit board.

Figure 2:
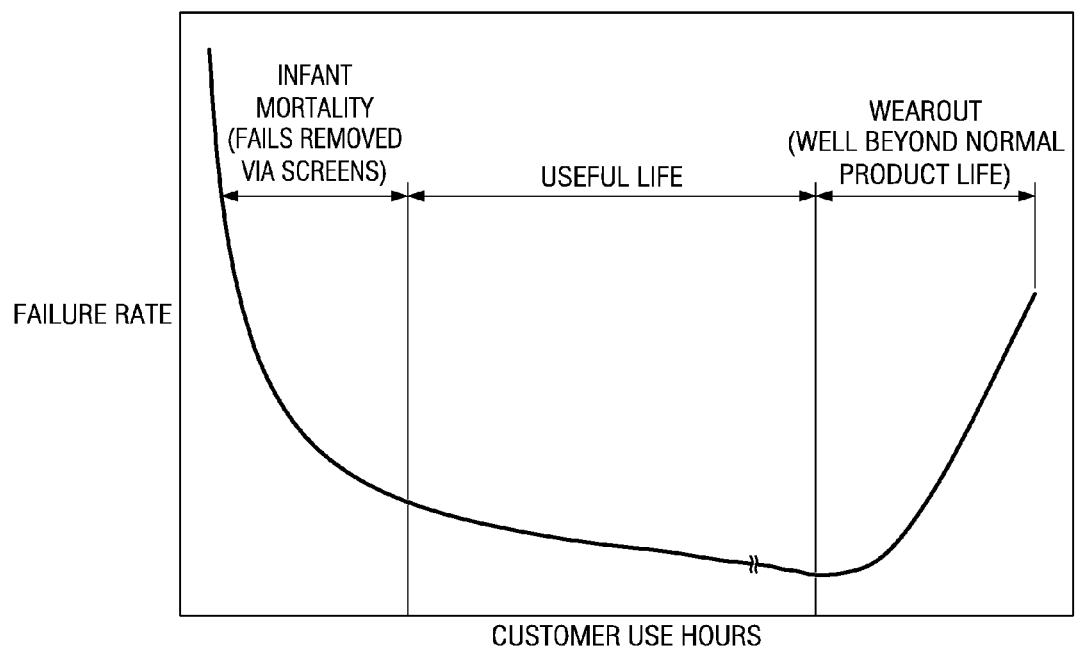
FIG. 2 is an exemplary diagram illustrating the bathtub curve of failure rates versus time for integrated circuit chips.

As discussed previously, the burn-in process is intended to accelerate the life of the multicore microprocessor integrated circuit chip through the infant mortality region of the bathtub curve representing the relationship between failure rates and time, as shown in FIG. 2. In addition to performing the burn-in process for identifying defective chips, the burn-in process of the illustrative embodiments is used to adjust the operating characteristics of the individual cores in a customized manner so that a uniform power and consumption from all of the cores is achieved.

For example, with the burn-in process of the illustrative embodiments, differing burn-in voltages may be applied to at least two of the nine processors in the CBE architecture shown in FIG. 1 so as to modify their operating voltages to be within a tolerance of each other. For example, if it is determined that SPE 120 is operating at 10% higher power, i.e. higher operating voltage, than the other SPEs 122-134 and PPE 110, then the burn-in voltage of SPE 120 may be adjusted and/or applied for a longer period of time so as to reduce the power, i.e. operating voltage, of SPE 120 to be within a predetermined tolerance of the other SPEs 122-134 and PPE 110. In this way, all of the SPEs 120-134 and PPE 110 may utilize a single voltage plane.

Figure 4:
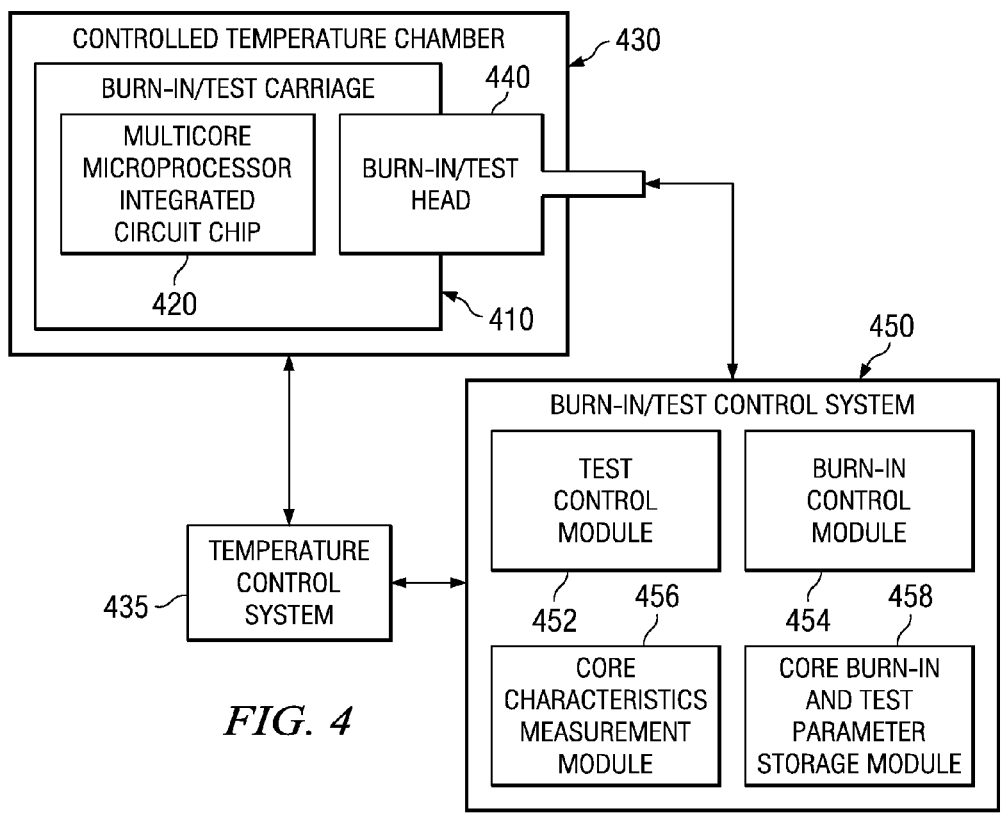
FIG. 4 is an exemplary block diagram of a customized burn-in mechanism in accordance with one illustrative embodiment.

FIG. 4 is an exemplary block diagram of a customized burn-in mechanism in accordance with one illustrative embodiment. As shown in FIG. 4, the customized burn-in mechanism includes a burn-in/test carriage 410 upon which the multicore microprocessor integrated circuit chip 420 may be placed for purposes of burn-in and/or testing of the chip 420. The burn-in/test carriage 410 may be provided in, or placed into, a controlled temperature chamber 430 whose temperature is controlled by a temperature control system 435 to be at a desired temperature for burn-in and/or testing.

A burn-in/test head 440 may be placed in contact with the chip 420 in order to provide appropriate burn-in and/or test voltages and signals. An example of one type of burn-in/test head 440 that may be used with the mechanisms of the illustrative embodiments is described in commonly assigned U.S. Pat. No. 6,094,059, which has been incorporated by reference.

The voltages and signals applied by the burn-in/test head 440 are controlled by burn-in/test control system 450. The burn-in/test control system 450 is preferably a computing device having a test control module 452, a burn-in control module 454, a core characteristics measurement module 456, and a core burn-in and test parameter storage device 458. The various modules provided in the burn-in/test control system 450 may be implemented as hardware, software, or any combination of hardware and software. In a preferred embodiment, the modules 452-456 are implemented as software instructions executing on one or more processing devices within the burn-in/test control system 450. The burn-in/test control system 450 contains logic and/or software for controlling and orchestrating the operation of the various modules 452-456 and their interaction with the burn-in test head 440, the temperature control system 435, and the core burn-in and test parameter storage device 458.

The test control module 452 is responsible for testing the various elements of the multicore microprocessor integrated circuit chip 420 to ensure proper operation of the chip 420. The operation of the test control module 452 is outside the scope of the illustrative embodiments and thus, a more detailed description of its operation is not provided herein. However, those of ordinary skill in the art will readily understand how testing of integrated circuit chips is performed using such a test control module 452 and a burn-in/test head 440.

The burn-in control module 454 contains, or otherwise is able to access, one or more computer readable programs having computer executable code that causes the burn-in control module 454 to implement operations in accordance with the illustrative embodiments. The burn-in control module 454 controls the measurement of core characteristics for each of the cores on the multicore microprocessor integrated circuit chip 420, and the adjustment of burn-in parameters for each of the cores in a dynamic and customized manner. The core characteristics measurement module 456 measures operating characteristics of the cores on the multicore microprocessor integrated circuit chip 420 and stores them for use by the burn-in control module 454 in dynamically adjusting the burn-in parameters for the cores.

The operational parameters of each core can be measured during wafer test and used to determine core burn-in parameters in a manner generally known in the art. The core burn-in and test parameter storage device 458 stores the core burn-in parameters for controlling the application of burn-in voltages, burn-in temperature, power, and time, for each of the cores. These parameters may be dynamically updated by the burn-in control module 454 based on measured core operating characteristics determined by the core characteristics measurement module 456. In addition, test parameters may be stored in the core burn-in and tests parameter storage device 458 for testing of the elements of the multicore microprocessor integrated circuit chip 420 to ensure proper operation of the chip 420 after burn-in.

During operation, when a dynamic multicore chip burn-in operation is initiated, after placement of the multicore microprocessor integrated circuit chip 420 into the burn-in/test carriage 410, the burn-in control module 454 first controls the burn-in/test head 440 to use initial chip-level burn-in parameters, i.e. temperature, voltage, power, and time, to perform the burn-in operation. In order to provide this initial chip-level burn-in parameters, as stated above, the cores are pre-measured at wafer test. Based on the measured data, a program is run to determine burn-in parameters for a desired functional operating voltage. These burn-in parameters are used to control the voltage/time that a burn-in unit applies to each core of the multicore microprocessor integrated circuit chip 420 so as to adjust the operating characteristics of the cores.

After this initialization, the dynamic core burn-in process is started for each of the cores on the multicore microprocessor integrated circuit chip 420. The same process may be performed for each core individually, with possibly differing core burn-in parameters being utilized due to the dynamic adjustment of these core burn-in parameters based on the measured core characteristics of the individual cores. Thus, for example, a first core may have its core burn-in parameters set to a first set of values based on the measured characteristics of that core, and a second core may have its core burn-in parameters set to a second set of values, that are different from the first set of values, based on the second core's measured characteristics.

The dynamic core burn-in process involves applying the initial core burn-in parameters to control the burn-in voltage and temperature applied, by the burn-in/test head 440, to the multicore microprocessor integrated circuit chip 420 for a specified period of time and then measuring the core characteristics, e.g., power used, performance, and other kinetic values, using the core characteristic measurement module 456. Typically, the time period that the burn-in voltage and temperature are applied to the multicore microprocessor integrated circuit chip 420 is on the order of two to three hours. The amount of time will be based on each core characteristic performance.

The measurements of the core characteristics are performed using a core test exerciser of the burn-in tool. The burn-in tool is designed to have a functional test interface to each module that is in burn-in so that the burn-in process can be monitored in real time. This is referred to as an "insitu" burn-in process. The "performance" of the core is measured by the core test exerciser calculating the time for the core to complete typical functions of data capture, manipulation, and transfer.

The core characteristic measurements are provided to the burn-in control module 454 which determines whether that particular core is operating within a given tolerance of the desired operating characteristics. In other words, a determination is made as to whether the core is operating as needed to allow a uniform power consumption across the entire chip.

If the core is not operating as needed, then the burn-in control module 454 adjusts the core burn-in parameters based on the measured core characteristics and the desired core characteristics. The new core burn-in parameters are then used to adjust the burn-in voltage, temperature, and/or time that is applied to the core by the burn-in/test head 440.

For example, assume there are four cores on a multicore processor, i.e. cores 0, 1, 2, and 3. Cores 1, 1 and 2 have performance measurements of 1.9 GHz but core 3 has a performance measurement 2.0 GHz. The burn-in time for core 3 will be increased relative to cores 0, 1 and 2 in order to slow down that core by 0.1 GHz. The amount of additional burn-in time required is based on the kinetics of NBTI for a given technology and product, which are calculated during a qualification cycle.

If the core is operating as needed, i.e. within a given tolerance of desired core operating characteristics, the burn-in control module 454 may determine if the burn-in process has run for a minimum burn-in time. If not, the burn-in control module 454 may again modify core burn-in parameters and continue application of burn-in voltages and temperatures based on these new core burn-in parameters. The process may be repeated until the burn-in process has run for a minimum burn-in time and the core is operating within a given tolerance of desired core operating characteristics. The burn-in voltage and temperature may then be discontinued. The chip 420 may then be tested or otherwise removed from the burn-in/test carriage 410.

The above dynamic core burn-in process may be performed for each core of the multicore microprocessor integrated circuit chip 420. These multiple dynamic core burn-in processes are preferably performed in parallel, although performing such processes in series is still within the scope and intent of the illustrative embodiments. Since each core is treated individually, the dynamic core burn-in process may be customized to the particular core being processed. As a result, a dynamic and customized core burn-in process is made available through the mechanisms of the illustrative embodiments.

The dynamic and customized core burn-in process of the illustrative embodiments may be used to adjust the operating characteristics, e.g., power, voltage, etc., of the cores such that there is a uniform power consumption across the entire multicore microprocessor integrated circuit chip. In this way, the cores may be configured to operate using a single voltage plane. However, the illustrative embodiments are not limited to such an application. Rather, any application that requires or would benefit from the fine tuning of core operating characteristics based on dynamic adjustment of core burn-in parameters to take advantage of NBTI affects made available through the illustrative embodiments is intended to be within the spirit and scope of the present invention.

For example, rather than adjusting all of the cores to be able to operating using a single voltage plane, the mechanisms of the illustrative embodiments may be used to adjust the operation of a subset of cores so that they use a common voltage plane while another set of cores are adjusted to use a different common voltage plane. In this way, the advantages of providing optimized voltage sources for differing cores may be obtained while minimizing the cost of providing voltage planes and voltage regulators in the chip and circuit board.

Figure 5:
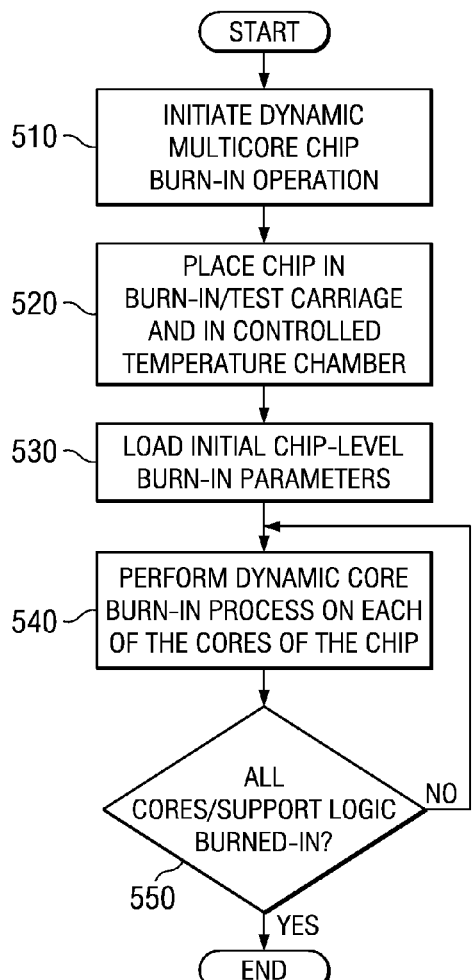
FIG. 5 is a flowchart outlining an exemplary operation for performing a burn-in process for a multicore microprocessor integrated circuit chip in accordance with one illustrative embodiment.
Figure 6:
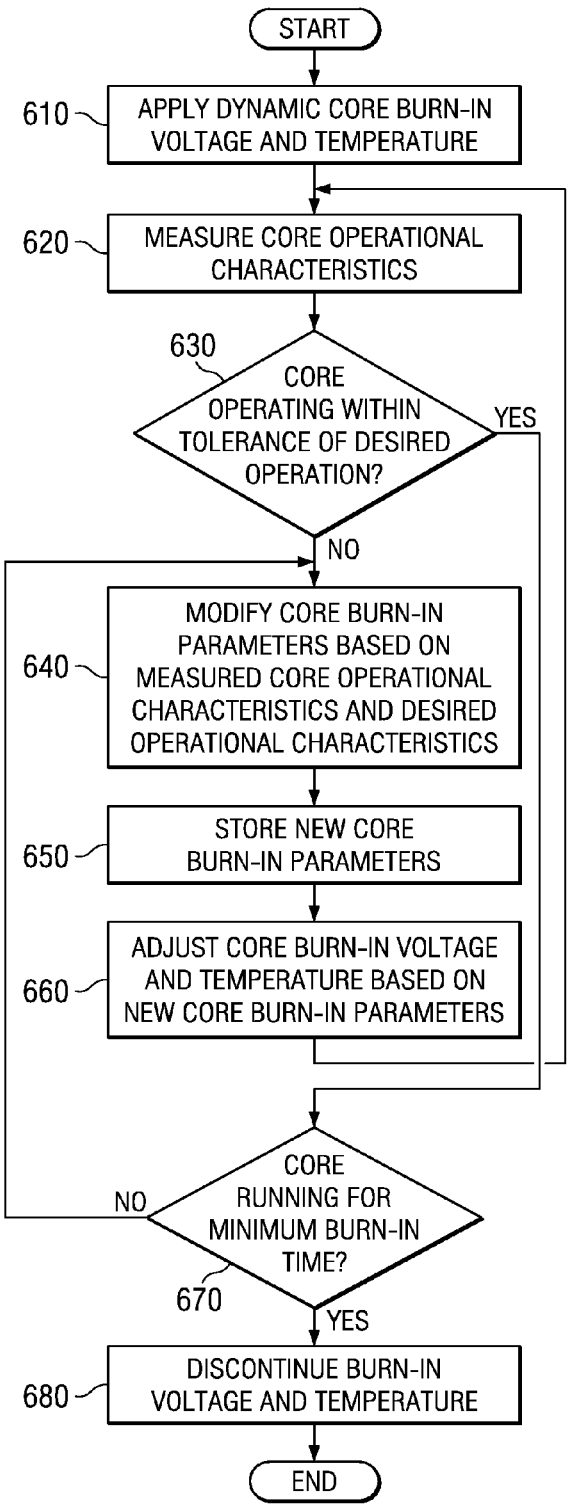
FIG. 6 is a flowchart outlining an exemplary operation for performing a dynamic customized core burn-in process for a core on a multicore integrated circuit device in accordance with one illustrative embodiment.

FIGS. 5 and 6 are flowcharts that outline exemplary operations of the illustrative embodiments. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

FIG. 5 is a flowchart outlining an exemplary operation for performing a burn-in process for a multicore microprocessor integrated circuit chip in accordance with one illustrative embodiment. As shown in FIG. 5, the operation starts by the initiation of a dynamic multicore chip burn-in operation (step 510). The initiation of this operation may be performed in response to a user input, an automated scheduling mechanism, an automated initiation from another mechanism involved in fabrication of integrated circuit chips, or the like, for example. The multicore microprocessor integrated circuit chip is placed into the burn-in/test carriage, such as via robotic fabrication equipment, which is in turn placed into a controlled temperature chamber (step 520).

The burn-in/test control system loads the initial chip-level burn-in parameters, e.g., temperature, voltage, power, time (step 530). The burn-in/test control system then performs the dynamic core burn-in process on each of the cores (step 540). The burn-in/test control system then determines if all of the cores and support logic have been burned-in using the dynamic core burn-in process (step 550). If not, the operation returns to step 540 and continues the dynamic core burn-in process for those cores and support logic that have not been processed accordingly. If all of the cores and support logic have been burned-in accordingly, the chip burn-in operation is complete and the operation terminates.

FIG. 6 is a flowchart outlining an exemplary operation for performing a dynamic customized core burn-in process customized burn-in for a core on a multicore microprocessor integrated circuit chip in accordance with one illustrative embodiment. The operation shown in FIG. 6 may correspond to the dynamic core burn-in operation referenced in step 540 of FIG. 5 for one core of a multicore microprocessor integrated circuit chip. It should be appreciated that the process outlined in FIG. 6 may be performed repeatedly in series for each core of the chip and the core's supporting logic or in parallel for each core of the chip and its supporting logic.

As shown in FIG. 6, the operation starts with the burn-in/test control system instructing the burn-in/test head and temperature control systems to apply the dynamic core burn-in voltage and temperature corresponding to the initial chip-level burn-in parameters for a predetermined period of time (step 610). The core characteristic measurement module then measures the operating characteristics, e.g., power used, performance, etc., of the core (step 620). These measurements are provided to the burn-in/test control system which determines whether the core is operating as needed, i.e. within a given tolerance of desired operational characteristics for the cores of the multicore microprocessor integrated circuit chip (step 630).

If the core is not operating as needed, the burn-in/test control system modifies the core burn-in parameters based on the measured core operational characteristics and the desired core operational characteristics (step 640). The burn-in/test control system stores these new core burn-in parameters in the burn-in and test parameters storage device (step 650) and uses them to adjust the applied burn-in voltage and/or temperature being applied to the multicore microprocessor integrated circuit chip (step 660). The operation then returns to step 620 and the operation is repeated.

If the core is operating as needed, i.e. within a given tolerance of desired operational characteristics, then the burn-in/test control module determines if the core has been running during the burn-in operation for a minimum burn-in time (step 670). If not, then the operation returns to step 640. This is to ensure that the proper burn-in time is still adhered to in order to achieve the acceleration of life of the chip through the infant mortality rate region of the bathtub curve shown in FIG. 2.

If the core has run for a minimum burn-in time and the core is operating as needed, then the burn-in voltage and temperature are discontinued (step 680). The operation then terminates.

Thus, the illustrative embodiments provide a mechanism by which dynamic customized burn-in of cores in a multicore microprocessor integrated circuit chip is achieved. The illustrative embodiments make use of the NBTI affects experienced by the application of the burn-in voltage to the cores to thereby adjust the operational characteristics of the cores so that a desired operation is achieved. In one illustrative embodiment, cores may have their operational characteristics adjusted so that they may be able to make use of a single voltage plane to provide voltages to all of the cores. This minimizes costs of the package and circuit board for a multicore microprocessor integrated circuit chip while achieving optimum operation of the individual cores.

Thus, the result of the application of the illustrative embodiments is a multicore microprocessor integrated circuit chip whose cores are dynamically adjusted by a dynamic burn-in process that is customized to the particular core based on the core's measured operating characteristics during the dynamic burn-in process. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections).

In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The illustrative embodiments may be implemented in an entirely hardware embodiment, an entirely software embodiment or an embodiment containing both hardware and software elements. In a preferred embodiment, the illustrative embodiments are implemented in software, which includes but is not limited to firmware, resident software, microcode, etc. For example, the illustrative embodiments may be implemented in software within the burn-in/test control system shown in FIG. 4.

Furthermore, the illustrative embodiments may take the form of a computer program product accessible from a computer-usable or computer-readable medium providing program code for use by or in connection with a computer or any instruction execution system, e.g., the burn-in/test control system in FIG. 4. For the purposes of this description, a computer-usable or computer readable medium may be any apparatus that may contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code, such as the burn-in/test control system in FIG. 4, may include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for dynamically burning-in cores of a multicore integrated circuit chip, comprising:
   applying an initial burn-in operation to a plurality of cores of the multicore integrated circuit chip based on an initial set of core burn-in parameters for the plurality of cores;
   measuring core operational characteristics of the plurality of cores;
   adjusting core burn-in parameters for at least one core of the plurality of cores based on the measured core operational characteristics to thereby generate a second set of core burn-in parameters; and
   applying a dynamic burn-in operation to the at least one core of the plurality of cores based on the second set of core burn-in parameters, wherein at least two cores of the multicore integrated circuit chip are burned-in using different burn-in voltages based on the dynamic burn-in operation.

2. The method of claim 1, further comprising:
   determining if the measured core operational characteristics of the plurality of cores are within a tolerance of a desired operation of the plurality of cores, wherein adjusting core burn-in parameters and applying the dynamic burn-in operation are performed in response to a determination that the measure core operational characteristics of the at least one core are not within a tolerance of the desired operation of the plurality of cores.

3. The method of claim 1, wherein the initial set of burn-in parameters are chip-level burn-in parameters that apply to all of the cores in the plurality of cores.

4. The method of claim 1, wherein the second set of core burn-in parameters comprises at least one group of burn-in parameters that are different from the first set of core burn-in parameters.

5. The method of claim 1, wherein applying the dynamic burn-in operation comprises applying, to at least one core of the plurality of cores, a higher or lower burn-in voltage than at least one other core of the plurality of cores.

6. The method of claim 1, wherein applying the dynamic burn-in operation comprises applying, to at least one core of the plurality of cores, a burn-in voltage for a longer period of time than at least one other core of the plurality of cores.

7. The method of claim 1, wherein the dynamic burn-in operation optimizes all of the cores of the plurality of cores to run at peak performance at a single operational voltage.

8. The method of claim 1, wherein applying the dynamic burn-in operation comprises applying a burn-in voltage to the transistor gates of the at least one core in the to thereby shift a voltage bias of the transistor gates to cause the transistor gates to operate at different voltages via negative bias temperature instability (NBTI) affects.

9. The method of claim 1, wherein applying the dynamic burn-in operation comprises using separate voltage planes to apply different burn-in voltages to at least two cores of the plurality of cores.

10. The method of claim 1, wherein the multicore integrated circuit chip is a heterogeneous multiprocessor device in which a main core operates based on a first instruction set and one or more other cores operate based on a second instruction set different from the first instruction set.

11. A computer program product comprising a computer useable medium having a computer readable program, wherein the computer readable program, when executed on a computing device, causes the computing device to:
   apply an initial burn-in operation to a plurality of cores of a multicore integrated circuit chip based on an initial set of core burn-in parameters for the plurality of cores;
   measure core operational characteristics of the plurality of cores;
   adjust core burn-in parameters for at least one core of the plurality of cores based on the measured core operational characteristics to thereby generate a second set of core burn-in parameters; and
   apply a dynamic burn-in operation to the at least one core of the plurality of cores based on the second set of core burn-in parameters, wherein at least two cores of the multicore integrated circuit chip are burned-in using different burn-in voltages based on the dynamic burn-in operation.

12. The computer program product of claim 11, wherein the computer readable program further causes the computing device to:
   determining if the measured core operational characteristics of the plurality of cores are within a tolerance of a desired operation of the plurality of cores, wherein adjusting core burn-in parameters and applying the dynamic burn-in operation are performed in response to a determination that the measure core operational characteristics of the at least one core are not within a tolerance of the desired operation of the plurality of cores.

13. The computer program product of claim 11, wherein the initial set of burn-in parameters are chip-level burn-in parameters that apply to all of the cores in the plurality of cores.

14. The computer program product of claim 11, wherein the second set of core burn-in parameters comprises at least one group of burn-in parameters that are different from the first set of core burn-in parameters.

15. The computer program product of claim 11, wherein the computer readable program causes the computing device to apply the dynamic burn-in operation by applying, to at least one core of the plurality of cores, a higher or lower burn-in voltage than at least one other core of the plurality of cores.

16. The computer program product of claim 11, wherein the computer readable program causes the computing device to apply the dynamic burn-in operation by applying, to at least one core of the plurality of cores, a burn-in voltage for a longer period of time than at least one other core of the plurality of cores.

17. The computer program product of claim 11, wherein the dynamic burn-in operation optimizes all of the cores of the plurality of cores to run at peak performance at a single operational voltage.

18. The computer program product of claim 11, wherein the computer readable program causes the computing device to apply the dynamic burn-in operation by applying a burn-in voltage to the transistor gates of the at least one core in the to thereby shift a voltage bias of the transistor gates to cause the transistor gates to operate at different voltages via negative bias temperature instability (NBTI) affects.

19. The computer program product of claim 11, wherein the computer readable program causes the computing device to apply the dynamic burn-in operation by using separate voltage planes to apply different burn-in voltages to at least two cores of the plurality of cores.

20. A system for dynamically burning-in cores of a multicore integrated circuit chip, comprising:
  a burn-in test control device; and
  a burn-in test head coupled to the burn-in test control device, wherein the burn in test control device, via the burn-in test head:
  applies an initial burn-in operation to a plurality of cores of the multicore integrated circuit chip based on an initial set of core burn-in parameters for the plurality of cores;
  measures core operational characteristics of the plurality of cores;
  adjusts core burn-in parameters for at least one core of the plurality of cores based on the measured core operational characteristics to thereby generate a second set of core burn-in parameters; and
  applies a dynamic burn-in operation to the at least one core of the plurality of cores based on the second set of core burn-in parameters, wherein at least two cores of the multicore integrated circuit chip are burned-in using different burn-in voltages based on the dynamic burn-in operation.

* * * * *